United States Patent [19]
Tanabe et al.

[11] Patent Number: 5,659,258
[45] Date of Patent: Aug. 19, 1997

[54] LEVEL SHIFTER CIRCUIT

[75] Inventors: Tetsuya Tanabe; Satoru Tanoi; Yasuhiro Tanaka, all of Tokyo, Japan

[73] Assignee: Oki Electric Industry Co., Ltd., Tokyo, Japan

[21] Appl. No.: 365,471

[22] Filed: Dec. 27, 1994

[30] Foreign Application Priority Data

Dec. 28, 1993 [JP] Japan .................. 5-338215

[51] Int. Cl.⁶ .................. H03K 19/0185; H03K 19/0948
[52] U.S. Cl. .................. 326/68; 326/81; 326/83
[58] Field of Search .................. 326/68, 80–81, 326/83, 86, 112, 119, 121

[56] References Cited

U.S. PATENT DOCUMENTS

| | | | |
|---|---|---|---|
| 4,318,015 | 3/1982 | Schade, Jr. .................. | 326/68 |
| 5,144,162 | 9/1992 | Tran .................. | 326/86 |
| 5,321,324 | 6/1994 | Hardee et al. .................. | 326/80 |
| 5,444,396 | 8/1995 | Soneda .................. | 326/81 |

OTHER PUBLICATIONS

K. Komatsuzaki et al, "Circuit Techniques For a Wide Word I/O Path 64 Meg DRAM", VSLI Synposium 91, pp. 133–134.

Anantha Chandrakasan et al, "A Lower Power Chipset for Portable Multimedia Applications", 1994 IEEE International Solid-State Circuits Conference, pp. 82–83.

*Primary Examiner*—Edward P. Westin
*Assistant Examiner*—Jon Santamauro
*Attorney, Agent, or Firm*—Rabin, Champagne & Lynt, P.C.

[57] ABSTRACT

There is provided a level shifter circuit which operates such that when the potential of the input signal changes from the ground potential to the first power source potential, the third transistor turns to be ON, and the fifth transistor turns to be OFF. On this instance, since the potential of the output signal is higher than the first power source potential, the second electrode of the first transistor is initiated to be charged up through the third and the fourth transistors. After that, the potential of the output signal falls down when the eighth transistor turns to be ON state. Since the potential of the second electrode of the first transistor has been charged up, the second transistor quickly turns to be OFF state so that the rush current is reduced flown from the second power source potential to the ground potential. When the potential of the output signal drops down enough, the fourth transistor turns to be OFF state so that the rush current flown from the second power source potential to the first power source potential is prevented.

22 Claims, 10 Drawing Sheets

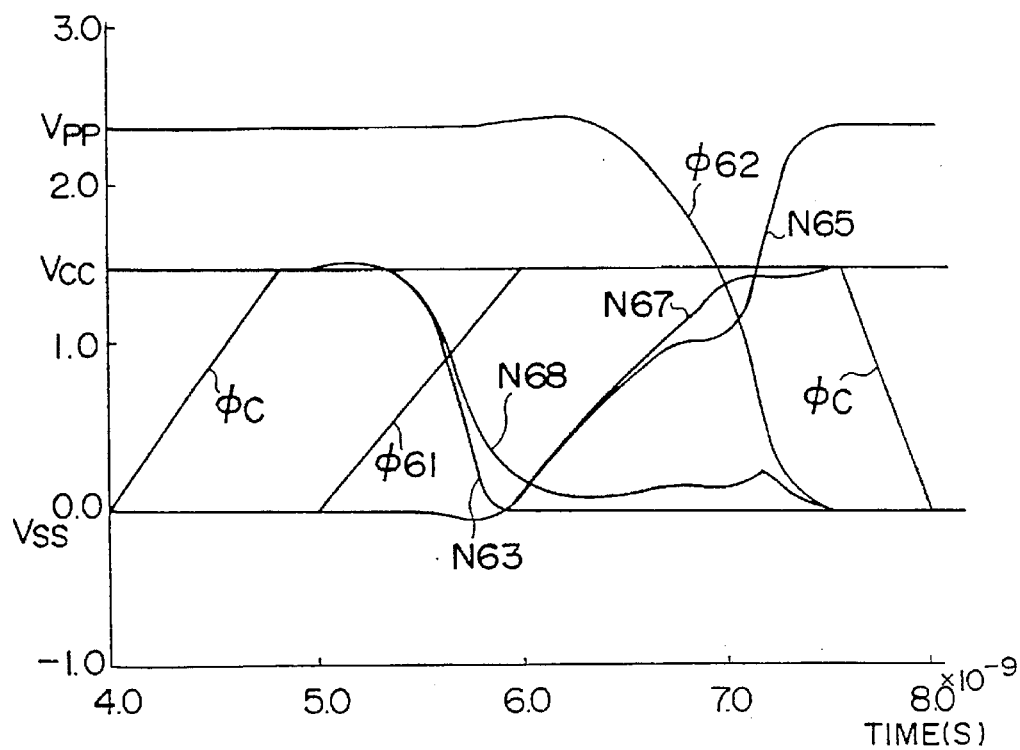
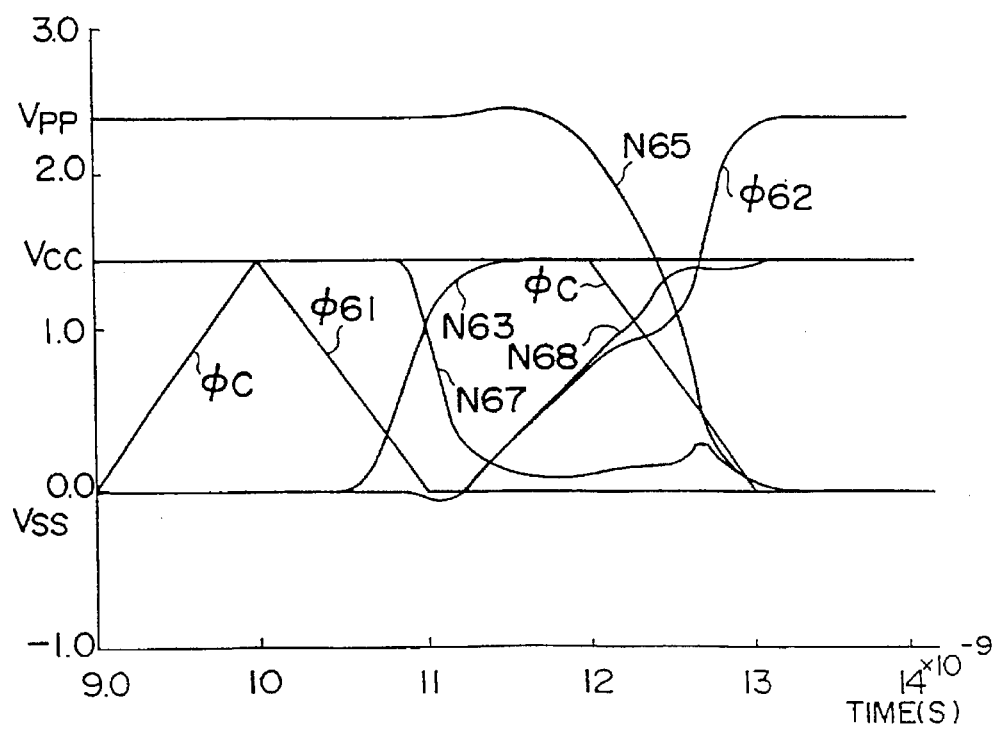

LEVEL SHIFTER CIRCUIT

REFERENCE TO RELATED APPLICATION

This application claims the priority right under 35 U.S.C. 119, of Japanese Patent Application No. Hei 05-338215 filed on Dec. 28, 1993, the entire disclosure of which is incorporated herein by reference.

BACKGROUND OF THE INVENTION

1. Field of the Invention

The present invention relates to a level shifter circuit which generates an output signal having a desired level in response to the level of an input signal and more particularly to a level shifter circuit effectively employed in a semiconductor device or the like.

2. Description of Related Art

FIG. 2 is a circuit diagram illustrating a conventional level shifter circuit which converts the voltage level of the potential difference between the first power source voltage Vcc and an input signal $\phi 1$, input from an input terminal 1, having an amplitude of the ground voltage Vss, into the voltage level of an output signal $\phi 2$, output from an output terminal 2 to a second stage circuit, having an amplitude of the potential difference between the second power source voltage Vpp higher than the first power source voltage Vcc and the ground voltage Vss.

The level shifter circuit shown in FIG. 2 incorporates therein an inverter 3 which inputs the input signal $\phi 1$ and an inverter 4 which inputs the output of the inverter 3 through a node N3 and outputs an inverted signal of the output from the inverter 3. The level shifter circuit also incorporates P channel type field effect transistors (hereinafter referred as PMOS) 5 and 6, in which the power source voltage Vpp is applied to each source and each drain is cross-connected to the other each gate, and N channel type field effect transistors (hereinafter referred as NMOS) 7 and 8 which are respectively connected between the drains of each PMOS 5 and PMOS 6 and the ground Vss and turn on and off in accordance with a potential level of a node N3 or a node N4 input to each gate. The drain of NMOS 7 is connected, at a node N5, to the drain of PMOS 5, and PMOS 6 turns on and off in response to the potential of the node N5. The drain of NMOS 8 is connected, at a node N6, to the drain of PMOS 6, and PMOS 5 turns on and off for outputting the potential level of the node N6 in response to the potential of the node N6.

FIG. 3 is a-waveform chart illustrating various operational waveforms of the level shifter circuit shown in FIG. 2. Now, description will be made as to an operation of the level shifter circuit shown in FIG. 2 with reference to FIG. 3.

When the potential level of the input signal $\phi 1$ changes from the potential Vss to the potential Vcc, the potential level of the node N4 becomes. Vcc by the two inverters 3 and 4, which causes NMOS 8 to turn on as shown in FIG. 3(a) so as to drop the potential of the output signal $\phi 2$. Concurrently, NMOS 7 turns to be off-state so that the potential of the node N5 turns to be the potential Vpp through PMOS 5 having on-state, in response to the potential of the output signal $\phi 2$. When the potential of the node N5 turns to be the potential Vpp, PMOS 6 turns to be off-state, which causes the level of the node N6 to be the ground level Vss so that the level of the output signal $\phi 2$ becomes the ground potential Vss.

Consequently, when the potential level of the input signal $\phi 1$ changes from the potential level Vcc to the potential Vss, the inverter 3 changes the level of the node N3 from the ground potential level Vss to the potential level Vcc and turns NMOS 7 to be on-state. The inverter 4 changes the level of the node N4 to be the ground potential level Vss. As a result, NMOS 8 turns to be off-state, the level of the node N5 drops down from the potential level Vpp to the potential level Vss, and PMOS 6 and PMOS 5 respectively turn to be on and off states. Accordingly, the level of the node N6 becomes the potential level Vpp and the level of the output signal $\phi 2$ becomes the potential level Vpp.

As described above, when the potential level of the input signal $\phi 1$ changes from the potential level Vss to the potential level Vcc, the potential level of the output signal $\phi 2$ shifts from the level Vpp to the level Vss. On the other hand, when the potential level of the input signal $\phi 1$ changes from the level Vcc to the level Vss, the potential level of the output signal $\phi 2$ shifts from the level Vss to the level Vpp.

There is disclosed a conventional level shifter circuit similar to the aforementioned one shown in FIG. 2 applied to a DRAM word line driving circuit in, for example, an article entitled as "Circuit Techniques For a Wide Word I/O Oath 64 Meg DRAM" authored by K. Komatsuzaki et al. and published in a VLSI symposium 91.

FIG. 4 is a circuit diagram illustrating another conventional level shifter circuit, and FIG. 5 is a waveform chart illustrating operational waveforms of the circuit shown in FIG. 4. The circuit shown in FIG. 4 is constructed by supplementing a latch circuit 10 in the level shifter circuit shown in FIG. 2. As a result, the level shifter circuit shown in FIG. 4 can perform a level conversion operation similarly as the conventional circuit shown in FIG. 2 if a control signal $\phi c$ is being supplied. However, if the control signal $\phi c$ is not being supplied, the output signal maintains a constant level regardless of the level of the input signal.

The level shifter circuit employs the latch circuit 10 for holding a potential which connects therethrough respective drains of PMOS 5, PMOS 6, NMOS 7 and NMOS 8. The latch circuit 10 is constituted of two transistors NMOS 11 and NMOS 12, each gate and drain of which is mutually cross connected with each other between the drains of each PMOS 5 and PMOS 6, and each source of which is connected to the ground potential level Vss, and a switch circuit 13. The switch circuit 13 is constituted of NMOS 15 which connects PMOS 5 with NMOS 7 by applying the control signal $\phi c$ to its gate, and NMOS 16 which connects PMOS 6 with NMOS 8 by applying the control signal $\phi c$ to its gate.

The level shifter circuit shown in FIG. 4 can operate in the same manner as the level shifter circuit shown in FIG. 2, the operational waveforms of which is shown in FIG. 5, provided that the control signal $\phi c$ is being supplied, and can operate in such a manner that NMOS 15 and 16 turn to be off state if the control signal $\phi c$ is not provided. Accordingly, the potential level of the output signal $\phi 2$ is preserved regardless of the potential of the input signal $\phi 1$.

However, the conventional level shifter circuit encounters the following problems.

When the potential of the input signal $\phi 1$ changes from the potential Vcc to the potential Vss or from the potential Vss to the potential Vcc, a rush current flows from the second power source potential Vpp to the ground potential Vss.

There is another problem that a delay time is long which is defined as a period of time during when the potential of the output signal $\phi 2$ changes from the potential Vss to the potential Vpp after the potential of the input signal $\phi 1$ has changed from the potential Vcc to the potential Vss or during when the potential of the output φ2 changes from the potential Vpp to the potential Vss after the potential of the input signal φ1 has changed from the potential Vss to the potential Vcc. In other words, when the input signal φ1 changes, as shown in FIG. 3(a), from Vcc to Vss, the inverter 3 changes the potential of the node N3 from Vss to Vcc, thereby NMOS 7 turning to be on-state. However, since the output signal φ2 still stays in the potential Vss, both of PMOS 5 and NMOS 7 turn to be ON-state so that a large amount of rush current I1 flows and it also takes time that the potential of the node N5 turns to be the potential Vss. Further, when the potential of the node N5 drops, causing to turn PMOS 6 on, a large amount of rush current flows up until when the potential of the node N4 turns to be the potential Vss.

Next, when the potential of the input signal φ1 changes, as shown in FIG. 3(b), from the potential Vss to the potential Vcc, the potential of the node N4 changes, by the inverters 3 and 4, from the potential Vss to the potential Vcc. Accordingly, NMOS 8 turns to be ON-state, causing to turn both of PMOS 6 and NMOS 8 on, so that a large amount of rush current flows.

On the other hand, it is prevented that the potential of the output signal φ2 turns to be the potential Vss. Although no rush current flows in the level shifter circuit shown in FIG. 4 if the control signal φc is not input because level shift has not occurred, the rush current flows in the same way, like the circuit shown in FIG. 2, if the level shift has been occurred by inputting the control signal φc. There is also a problem that the delay time is long during when the potential of the output signal φ2 changes from the potential Vss to the potential Vpp after the potential of the input signal φ1 has changed from the potential Vcc to the potential Vss or during when the potential of the output φ2 changes from the potential Vpp to the potential Vss after the potential of the input signal φ1 has changed from the potential Vss to the potential Vcc.

As described above, the conventional technology has problems that the rush current has inevitably been generated and the delay time is long. In a semiconductor circuit, in particular, in which the second power source potential is generated internally, increase of the rush current imposes heavy burdens on the internal voltage elevation circuit, which has caused a problem to affect operations of the other circuits.

SUMMARY OF THE INVENTION

It is, therefore, an object of the present invention to provide a level shifter circuit enabling to solve the problems that a large amount of rush current flows and a delay time is long.

To accomplish the above object, there is provided a level shifter circuit for generating an output signal having a desired level in accordance with a level of an input signal driven by a first power source potential, incorporating therein (a) a first and a second transistors with a first conductivity type each having a first, a second and a control electrodes; each first electrode being connected to a second power source potential different from the first power source potential; the second electrode of the first transistor being connected to the control electrode of the second transistor which controls conductance between the first and the second electrodes; the second electrode of the second transistor being cross connected to the control electrode of the first transistor which controls conductance between the first and the second electrodes; (b) a first driving circuit connected between the first power source potential and a ground potential for controlling a potential of the second electrode of the first transistor in accordance with potentials of the input signal and the second electrode of the second transistor; and (c) a second driving circuit connected between the first power source potential and the ground potential for controlling, a potential of the second electrode of the second transistor in accordance with a complementary potential relative to the potential of the input signal and a potential of the second electrode of the first transistor.

According to another aspect of the present invention, the first driving circuit is constituted of (i) a third transistor with the first conductivity type having a first, a second and a control electrodes which turns on and off in accordance with the potential of the input signal applied to the control electrode; the first electrode being connected to the first power source electrode; (ii) a fourth transistor with a second conductivity type having a first, a second and a control electrodes; the first electrode being connected to the second electrode of the third transistor; the control electrode being connected to the second electrode of the second transistor; the second electrode being connected to the second electrode of the first transistor; and (iii) a fifth transistor with the second conductivity type having a first, a second and a control electrodes which turns on and off in accordance with the potential of the input signal applied to the control signal; the first electrode being connected to the second electrode of the fourth transistor; the second electrode being connected to the ground potential; and the second driving circuit is constituted of (iv) a sixth transistor with the first conductivity type having a first, a second and a control electrodes which turns on and off in accordance with a complementary potential relative to the potential of the input signal input to the first driving circuit applied to the control electrode; (v) a seventh transistor with the second conductivity type having a first, a second and a control electrodes; the first electrode being connected to the second electrode of the sixth transistor; the control electrode being connected to the second electrode of the first transistor; the second electrode being connected to the second electrode of the second transistor; and (vi) an eighth transistor with the second conductivity type having a first, a second and a control electrodes which turns on and off in accordance with the complementary potential relative to the potential of the input signal input to the first driving circuit applied to the control electrode.

According to still another aspect of the present invention, there is provided a level shifter circuit for generating an output signal having a desired level in accordance with a level of an input signal driven by a first power source potential, incorporating therein (a) a ninth and a tenth transistors with a first conductivity type each having a first, a second and a control electrodes; each first electrode being connected to a second power source potential different from the first power source potential; the second electrode of the ninth transistor being connected to the control electrode of the tenth transistor which controls conductance between the first electrode and the second electrode; the second electrode of the tenth transistor being cross connected to the control electrode of the ninth transistor which controls conductance between the first and second electrodes; (b) a third driving circuit, which operates with a potential difference between the first power source potential and a ground potential, for generating a first driving signal having two potential levels in accordance with a potential of the input signal; (c) a fourth driving circuit, which operates with the potential difference between the first power source potential and the ground potential, for generating a second driving signal having a complementary potential relative to a potential of the first driving signal; (d) an eleventh transistor with a second conductivity type having a first, a second and a control electrodes; the second electrode being connected to the second electrode of the ninth transistor; the control electrode being connected to the second electrode of the tenth transistor; the first electrode being connected to an output stage of the third driving circuit; and (e) a twelveth transistor with the second conductivity type having a first, a second and a control electrodes; the second electrode being connected to the second electrode of the tenth transistor; the control electrode being connected to the second electrode of the ninth transistor; the first electrode being connected to an output stage of the fourth driving circuit.

According to further aspect of the present invention, there is provided a level shifter circuit for generating an output signal having a desired level in accordance with a level of an input signal driven by a first power source potential, incorporating therein (a) a 13th and a 14th transistors with a first conductivity type each having a first, a second and a control electrodes; each first electrode being connected to a second power source potential different from the first power source potential; the second electrode of the 13th transistor being connected to the control electrode of the 14th transistor which controls conductance between the first and the electrodes; the second electrode of the 14th transistor being cross connected to the control electrode of the 13th transistor which controls conductance between the first and second electrodes; (b) a 15th transistor with a second conductivity type having a first, a second and a control electrodes; the second electrode being connected to the second electrode of the 13th transistor; the control electrode of the 14th transistor being connected to the second electrode of the 14th transistor; (c) a 16th transistor with the second conductivity type having a first, a second and a control electrodes; the second electrode being connected to the second electrode of the 14th transistor; the control electrode being connected to the second electrode of the 13th transistor; (d) a potential holding circuit connected between the first electrodes of the 15th and the 16th transistors which operates with a potential difference between the first power source potential and a ground potential and preserves potentials of the first electrodes of the 15th and 16th transistors; (e) a fifth driving circuit which turns on and off in accordance with a potential of the input signal and connects the first electrode of the 15th transistor with the ground potential when the circuit turns to be ON state; and (f) a sixth driving circuit which turns on and off complementarily relative to the fifth driving circuit in accordance with the potential of the input signal and connects the first electrode with the ground potential when the circuit turns to be ON state.

According to the other aspect of the present invention, the potential holding circuit is further constituted of (i) a 21st and a 22nd transistors with the first conductivity type each having a first, a second and a control electrodes; each first electrode being connected to the first power source potential; the control electrode and the second electrode being mutually cross connected; (ii) a 23rd transistor with the second conductivity having a first, a second and a control electrodes; the second electrode being connected to the second electrode of the 21st transistor; which turns on and off in accordance with a potential of the second electrode of the 22nd transistor and connects the control electrode of the 22nd transistor with the ground potential when in ON state; (iii) a 24th transistor with the second conductivity type having a first, a second and a control electrodes; the second electrode being connected to the second electrode of the 22nd transistor; which turns on and off in accordance with a potential of the second electrode of the 21st transistor and connects the control electrode of the 21st transistor with the ground potential when in ON state; and (iv) a 25th transistor for connecting each first electrode of the 21st and 22nd transistors in accordance with the potential of the input signal.

According to still further aspect of the present invention, the circuit further incorporated therein a reset circuit for resetting an output regardless of the potential of the input signal including: (i) a 26th transistor connected to the first electrode of the 15th transistor for turning on and off in accordance with a potential of a reset signal and for connecting the first electrode of the 15th transistor with the ground potential when in ON state; and (ii) a 27th transistor connected to the first electrode of the 16th transistor for turning on and off in accordance with the potential of the reset signal and for connecting the first electrode of the 16th transistor with the first power source potential when in ON state.

According to the first aspect of the present invention, since the level shifter circuit is constructed such above, the first driving circuit operates in accordance with the input signal and the second electrode potential of the second transistor, and controls the second electrode potential of the first transistor. The second driving circuit operates in accordance with the inverted potential of the input signal and the second electrode potential of the first transistor, and controls the second electrode potential of the second transistor. The first transistor turns on and off in accordance with the second electrode potential of the second transistor and the second transistor turns on and off in accordance with the second electrode potential of the first transistor complementarily relative to the first transistor.

According to the second aspect of the present invention, the third and fifth transistors of the first driving circuit in the first aspect of the present invention complementarily turns on and off in accordance with the potential of the input signal, respectively. The fourth transistor turns on and off in accordance with the second electrode potential of the second transistor. For example, if the fourth transistor turns on when the third transistor is in ON state. The first power source potential is applied to the second electrode of the first transistor. On the other hand, the sixth and eighth transistors of the second driving circuit complementarily turn on and off, respectively, in accordance with the complementary potential relative to the input signal. The seventh transistor turns on and off in accordance with the second electrode potential of the first transistor. For example, if the seventh transistor turns on when the sixth transistor is in ON state, the first power source potential is applied to the second electrode of the second transistor.

According to the third aspect of the present invention, the ninth transistor turns on and off in accordance with the second electrode potential of the 10th transistor, whereas the 10th transistor complementarily turns on and off in accordance with the second electrode potential of the ninth transistor. When the 11th transistor is in ON state, the output potential of the third driving circuit is connected to the second electrode of the ninth transistor. When the 12th transistor is in ON state, the output potential of the fourth driving circuit is connected to the second electrode of the 10th transistor.

According to the fourth aspect of the present invention, the 13th transistor turns on and off in accordance with the second electrode potential of the 14th transistor, whereas the 14th transistor complementarily turns on and off relative to the 13th transistor in accordance with the second electrode potential of the 13th transistor. When the 15th transistor is in ON state, the first electrode potential of the 15th transistor is applied to the second electrode of the 13th transistor. When the 16th transistor is in ON state, the first electrode potential of the 16th transistor is applied to the second electrode of the 14th transistor. The potential holding circuit holds each first electrode potential of the 15th and 16th transistors. On the other hand, the fifth and sixth driving circuits control, in accordance with the potential of the input signal, conductivity of the path between the first electrodes of the 15th and 16th transistors and the ground. By employing the switch circuit, the conductivity between the first electrodes of the 15th and 16th transistors and the ground can be controlled in accordance with the potential of the control signal.

According to the fifth aspect of the present invention, the 21st transistor of the potential holding circuit in the fourth aspect of the present invention turns on and off in accordance with the second electrode potential of the 22nd transistor, whereas the 22nd transistor complementarily turns on and off relative to the 21st transistor in accordance with the second electrode potential of the 21st transistor. If the 23rd transistor turns on when the 25th transistor is in ON state, the second electrode of the 21st transistor is connected to the ground. On the other hand, if the 24th transistor turns on when the 25th transistor is in ON state, the second electrode of the 22nd transistor is connected to the ground.

According to the sixth aspect of the present invention, the 26th and 27th transistors employed in the level shifter circuit according to the fourth aspect of the present invention hold the first electrode potential to either the first power source potential or the connection potential.

BRIEF DESCRIPTION OF DRAWINGS

FIGS. 11a–11b is a waveform chart illustrating various operational waveforms appeared in the level shifter circuit shown in FIG. 10;

DETAILED DESCRIPTION OF THE PREFERRED EMBODIMENTS

Figure 1:
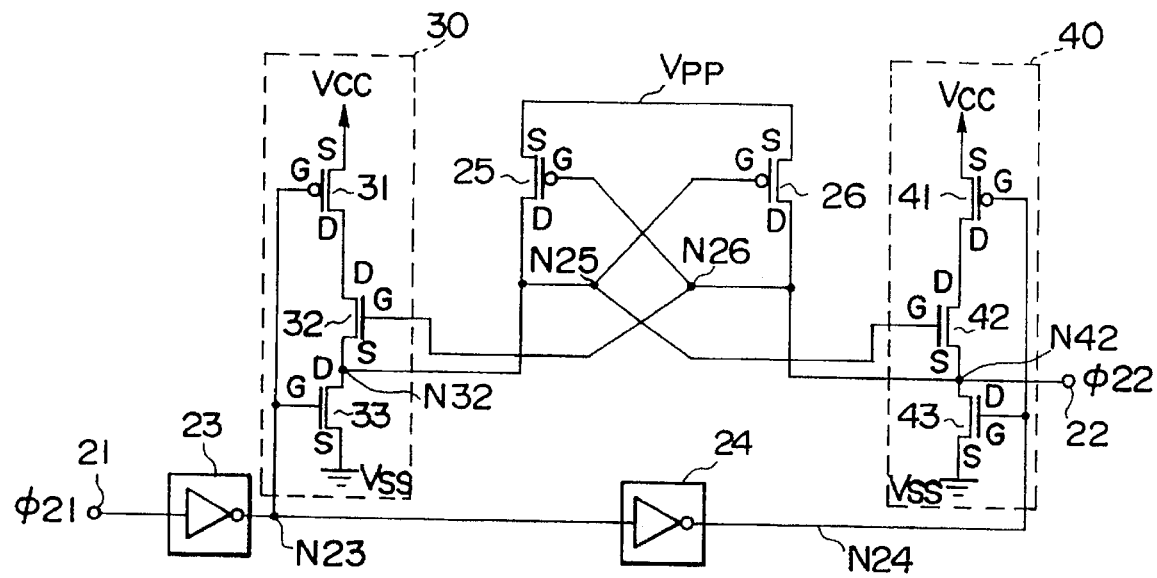
FIG. 1 is a circuit diagram illustrating a level shifter circuit according to the first embodiment of the present invention.

FIG. 1 is a circuit diagram illustrating a level shifter circuit according to the first embodiment of the present invention.

The level shifter circuit converts a level of an input signal $\phi 21$ having an amplitude of the potential difference between the first power source potential Vcc input through an input terminal 21 and the ground potential Vss, and outputs, through an output terminal 22 to a next stage circuit, an output signal $\phi 22$ having an amplitude of the potential difference between the second power source potential Vpp higher than the power source potential Vcc and the ground potential Vss.

The level shifter circuit shown in FIG. 1 incorporates therein a driving inverter 23 for driving the input signal $\phi 21$ so as to output a logic signal having two logic level potentials and a driving inverter 24 for inputting the output of the inverter 23 through a node N23 and outputting an inverted logic signal relative to the output of the inverter 23 from a node N24. Further, the level shifter circuit incorporates therein the first transistor, PMOS 25, and the second transistor, PMOS 26, each source, the first electrode, of which is commonly connected to the power source potential Vpp and each drain, the second electrode, of which is respectively cross connected to each other gate, a control electrode. The level shifter circuit also incorporates therein the first driving circuit 30 and the second driving circuit 40, both connected between the power source potential Vcc and the ground potential Vss, for controlling each potential of the gates of PMOS 25 and PMOS 26. The potential of a node N25 connecting the gate of PMOS 26 with the drain of PMOS 25 is controlled by the driving circuit 30, whereas the potential of a node N26 connecting the gate of PMOS with the drain of PMOS 26 is controlled by the second driving circuit 40. The first driving circuit 30 is constituted of the third transistor, PMOS 31, the source of which is connected to the power source potential Vcc, turning on and off in accordance with the potential of the node N23, the fourth transistor, NMOS 32, the drain of which is connected in series to the drain of PMOS 31, turning on and off in accordance with the potential of the node N26 applied to its gate, and the fifth transistor, NMOS 33, the drain and the source of which are respectively connected to the source of NMOS 32, at a node N32, and the ground potential Vss, turning on and off in accordance with the potential of the node N23. The nodes N32 and N23 are connected such that each node has an identical potential, whereby the potential of the node N26 is output as the output signal $\phi 22$.

The second driving circuit 40 is constituted of the sixth transistor, PMOS 41, the source of which is connected to the source power potential Vcc, turning on and off in accordance with the potential of the node N24, the seventh transistor, NMOS 42, the drain of which is connected in series to the drain of PMOS 41, turning on and off in accordance with the potential of the node N25 applied to its gate, and the eighth transistor, NMOS 43, the drain and the source of which are respectively connected to the source of NMOS 42 at a node N42 and the ground potential Vss, turning on and off in accordance with the potential of the node N24. The nodes N42 and N26 are connected such that each node has an identical potential.

FIG. 6 is a waveform chart illustrating various operational waveforms appeared in the level shifter circuit shown in FIG. 1. Now, description will be made as to an operation of the level shifter circuit shown in FIG. 1 with reference to FIG. 6.

FIG. 6 respectively shows each operational voltage waveform of the input signal φ21, the nodes N23, N24 and N25, and the output signal φ22.

Figure 6A:
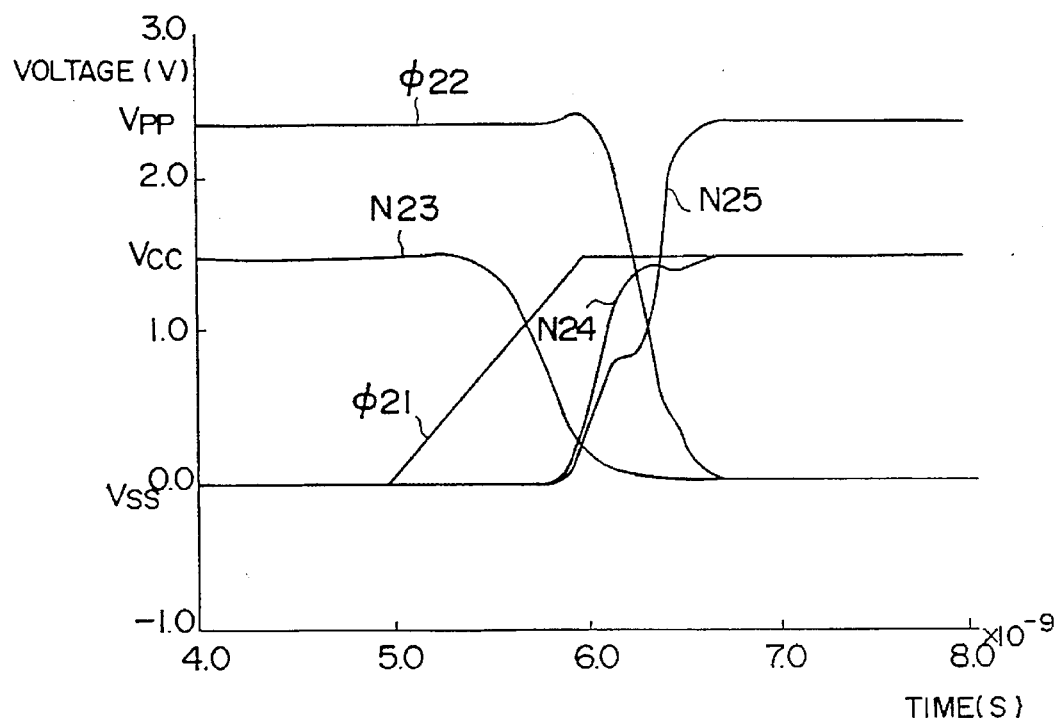
FIGS. 6a–6b is a waveform chart illustrating various operational waveforms appeared in the level shifter circuit shown in FIG. 1.

As shown in FIG. 6(a), assuming that the potential of the input signal φ21 is Vss, each potential of the nodes N23 and N24 respectively reveals Vcc and Vss so that PMOS 25 turns to be OFF state and PMOS 26 turns to be ON state. NMOS 32 and NMOS 42 maintain ON and OFF states, respectively. If the potential of the input signal φ21 changes from the potential Vss to the potential Vcc, the potential of the node N23 changes from the potential Vcc to the potential Vss, thereby PMOS 31 to be ON state and NMOS 33 to be OFF state. On this instance, since the potential of the output signal φ22, that is, the potential of the node N26 is higher enough than the potential Vcc, the node N25 is initiated to be charged up, through PMOS 31 and NMOS 32, by the power source potential Vcc. Then, the potential of the node N24 is changed from the potential Vss to the potential Vcc by the inverter 24, thereby NMOS 43 to be ON state, so that the potential of the output signal φ22 is discharged through NMOS 43 and dropped down from the potential Vpp. On this instance, since the potential of the node N25 has been charged up through PMOS 31 and NMOS 33, PMOS 26 can be quickly turned off. Accordingly, the rush current which flows, through PMOS 26, from the potential Vpp to the potential Vss can be minimized and the potential change of the output signal φ22 to the potential Vss can be done in a high speed. By dropped down the output signal φ22, the node N25 is further charged up through PMOS 25. Since NMOS 32 turns to be OFF state if the potential of the output signal φ22 drops down enough, the rush current from the potential Vpp to the potential Vcc can be prevented.

Figure 6B:
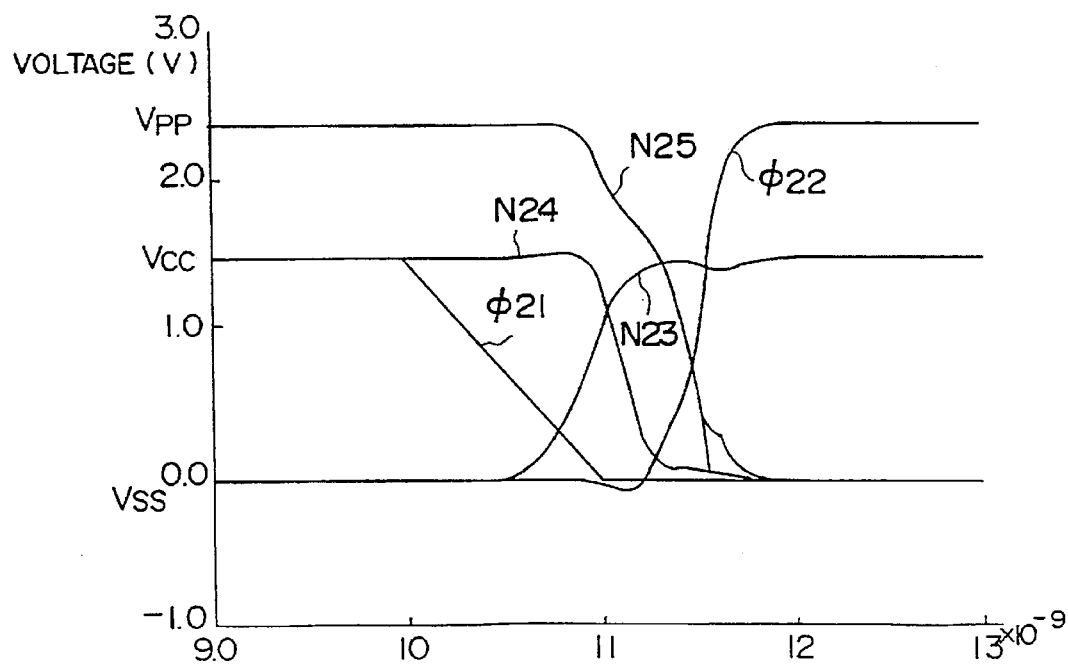

Then, if the potential of the input signal φ21 changes from the potential Vcc to the potential Vss as shown in FIG. 6(b), the potential of the node N23 changes from the potential Vss to the potential Vcc, thereby PMOS 31 to be OFF state and NMOS 33 to be ON state. On this instance, the potential of the node N25 is initiated to drop down from the potential Vpp.

The potential of the node N24 changes from the potential Vcc to the potential Vss by the inverter 24, thereby PMOS 41 to be ON state and NMOS 43 to be OFF state. At the moment, since the potential of the node N25 is higher enough than the potential Vcc, the potential of the output signal φ22 is initiated to be charged up through PMOS 41 and NMOS 42. Since dropping down of the potential of the node N25 and charging up through PMOS 41 and NMOS 42 are performed concurrently, PMOS 25 can be quickly turned off and the rush current which flows, through PMOS 25, from the potential Vpp to the potential Vss can be reduced. Further, the potential change of the output signal φ22 to the potential Vpp can be done in a high speed. By dropped down the potential of the node N25, PMOS 26 turns to be ON state so that the output signal φ22 continues to be charged up through PMOS 26. Further, the charge up can be accelerated by NMOS 42. When the potential of the node N25 drops down sufficiently, NMOS 42 turns to be OFF state, thereby preventing the rush current from the potential Vpp to the potential Vcc.

Figure 2:
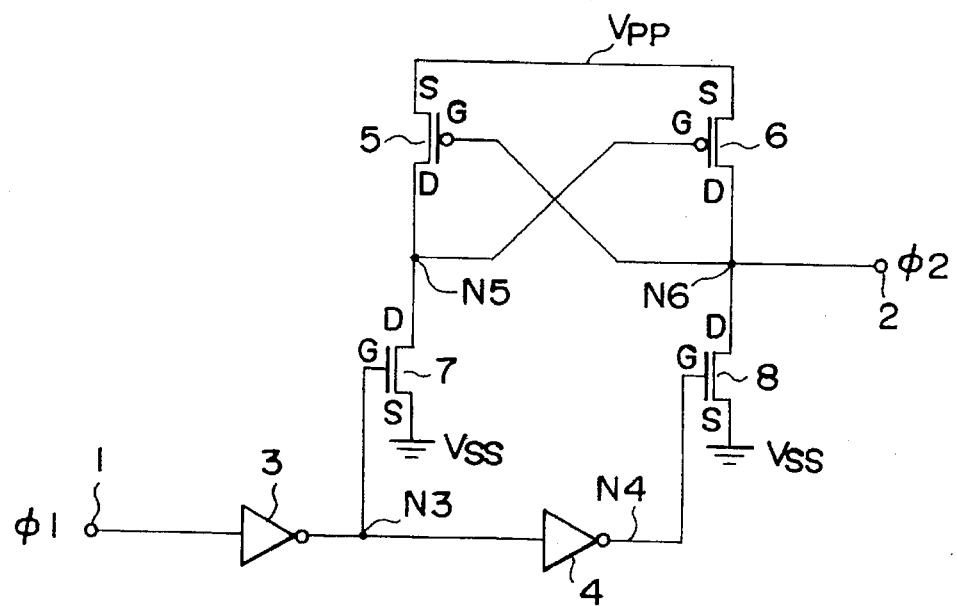
FIG. 2 is a circuit diagram illustrating a conventional level shifter circuit.
Figure 3A:
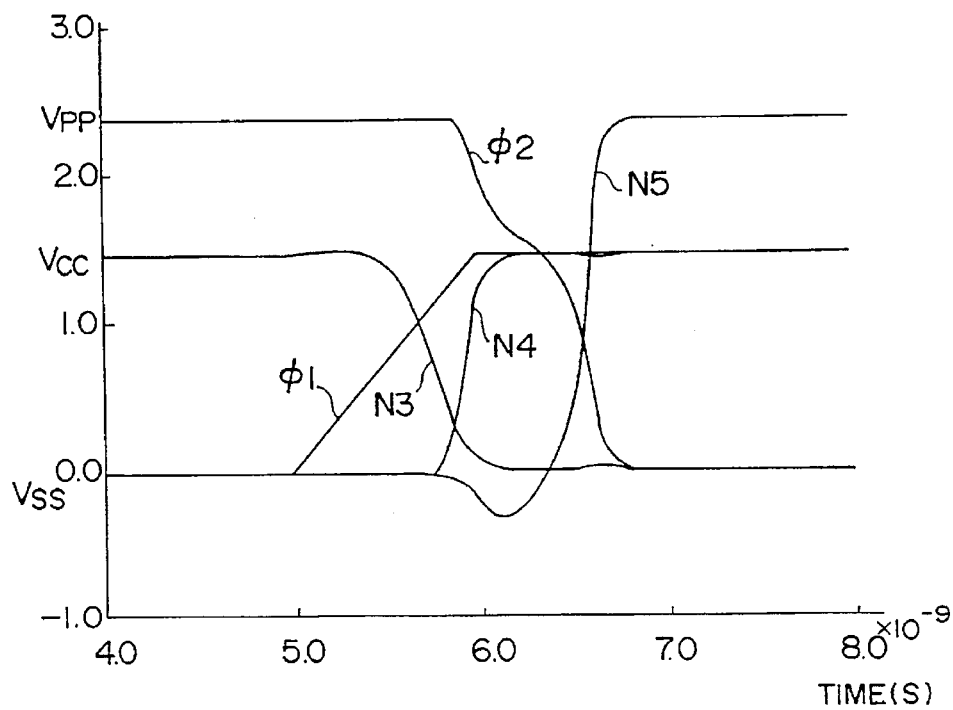
FIGS. 3a–3b is a waveform chart illustrating various operational waveforms appeared in the conventional circuit shown in FIG. 2.
Figure 3B:
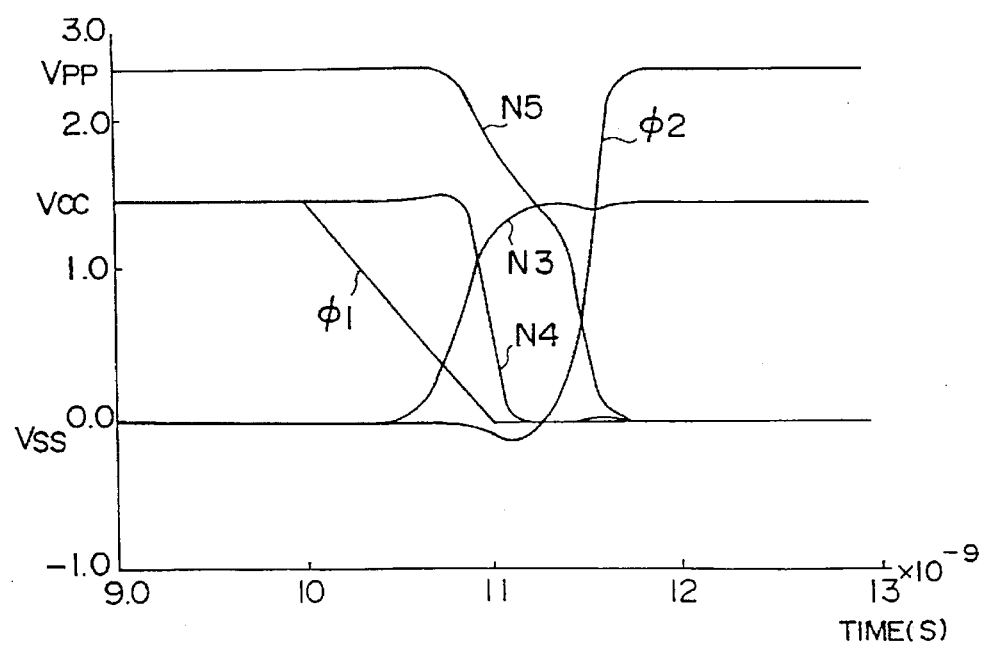
Figure 4:
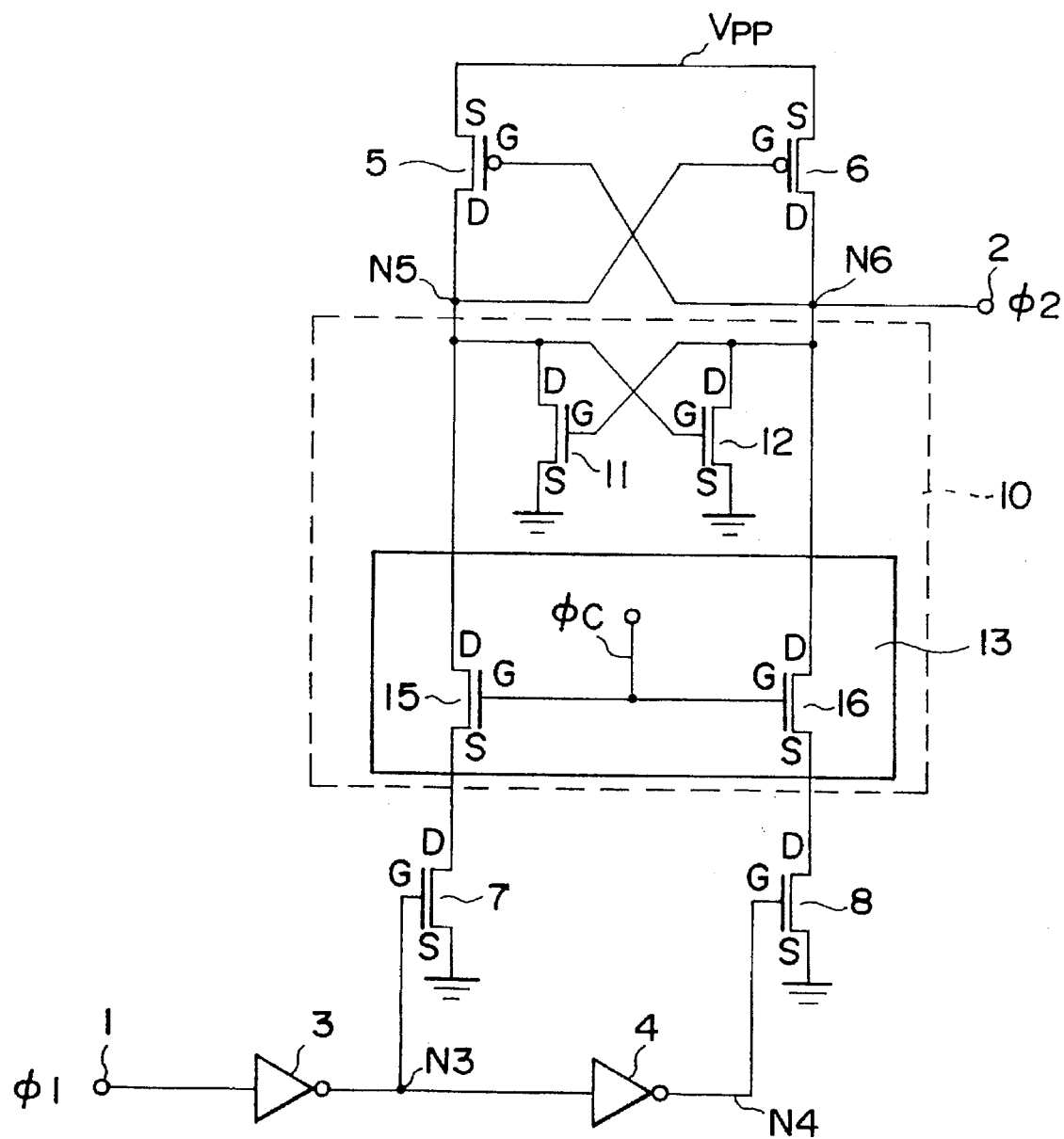
FIG. 4 is a circuit diagram illustrating another conventional level shifter circuit.
Figure 5:
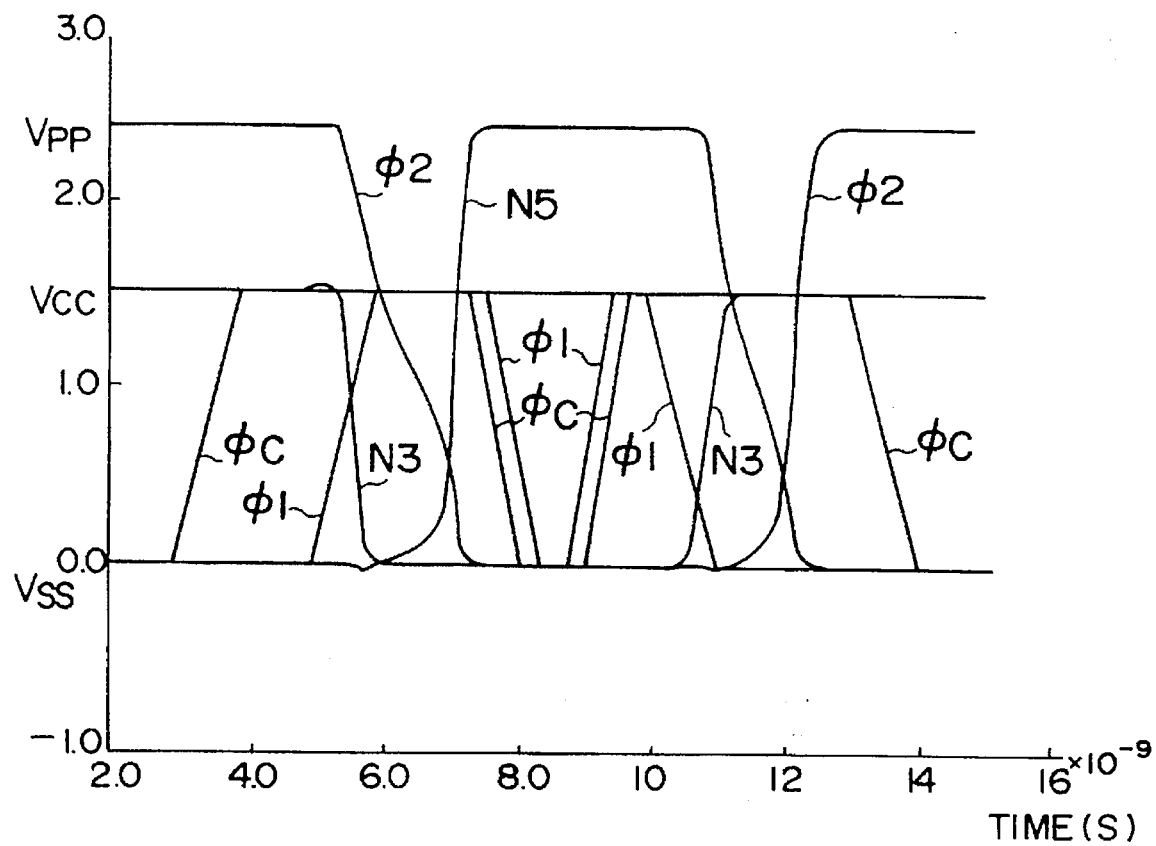
FIG. 5 is a waveform chart illustrating various operational waveforms appeared in the conventional circuit shown in FIG. 4.
Figure 7:
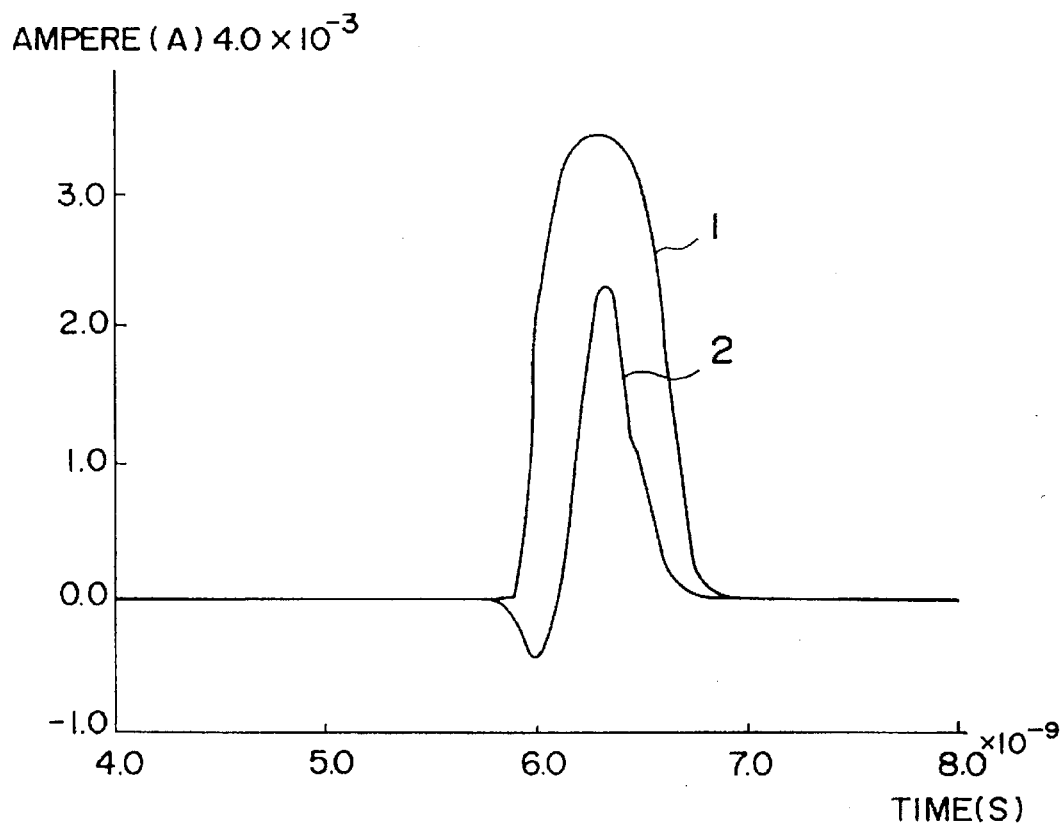
FIG. 7 is a comparison chart illustrating the comparison between a rush current generated in the level shifter circuit of the first embodiment shown in FIG. 1 and a rush current generated in the conventional level shift circuit shown in FIG. 2.

FIG. 7 is a comparison chart illustrating the comparison between a rush current generated in the level shifter circuit of the first embodiment shown in FIG. 1 and a rush current generated in the conventional level shifter circuit shown in FIG. 2; a numeral (1) indicates a rush current according to the conventional circuit whereas a numeral (2) indicates a rush current according to the present invention. As shown in the drawing, not only its amount but also the time during which the rush current flows are reduced as compared to those of the conventional circuit.

As described above, if the potential of the input signal φ21 changes from the potential Vss to the potential Vcc according to the present embodiment, the node N25 is charged up by NMOS 32 before PMOS 25 turns to be ON state. Accordingly, voltage change speed of each node N can be further accelerated and the rush current flown from the power source potential Vpp to the ground potential Vss can be also reduced. At the time when the potential of the node N26 drops down low enough or to the potential Vss, NMOS 32 is in OFF state so that a normal current can not flow from the potential Vpp to the potential Vcc. On the other hand, if the potential of the input signal φ21 changes from the potential Vcc to the potential Vss the potential of the output signal φ22 is charged up by NMOS 42 before PMOS 26 turns to be ON state. Accordingly, voltage change speed of each node N can be further accelerated and the rush current flown from the power source potential Vpp to the ground potential Vss can be also reduced. At the time when the potential of the node N25 drops down low enough or to the potential Vss, NMOS 42 is in OFF state so that a normal current can not flow from the potential Vpp to the potential Vcc.

Figure 8:
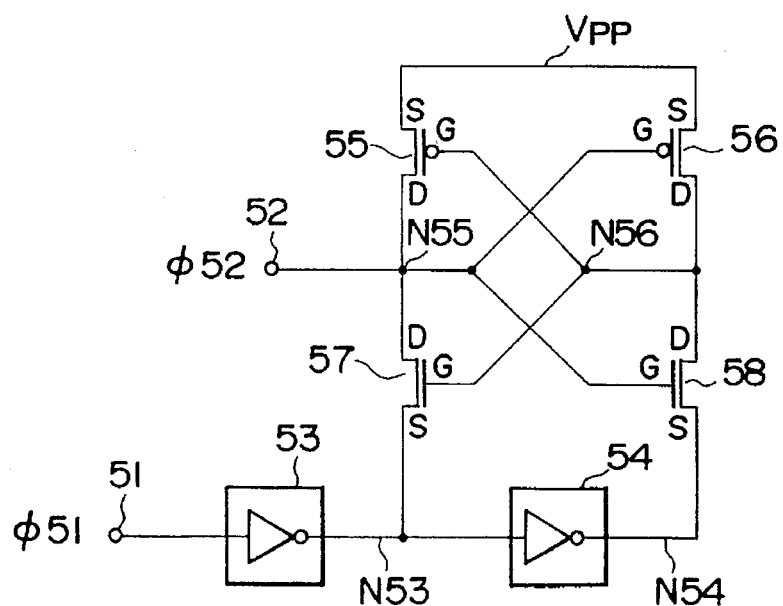
FIG. 8 is a circuit diagram illustrating a level shifter circuit according to the second embodiment of the present invention.

FIG. 8 is a circuit diagram illustrating a level shifter circuit according to the second embodiment of the present invention.

The level shifter circuit shown in FIG. 8 converts the voltage level of an input signal φ51, input from an input terminal 51, having an amplitude of the potential difference between the first power source voltage Vcc and the ground voltage Vss, into the voltage level of an output signal φ52, output from an output terminal 52 to a second stage circuit, having an amplitude of the potential difference between the second power source voltage Vpp higher than the first power source voltage Vcc and the ground voltage Vss.

The level shifter circuit shown in FIG. 8 incorporates therein the first driving circuit, an inverter 53, for driving the input signal φ51 so as to output a logic signal having two logic level potentials and the second driving circuit, an inverter 54, for inputting the output of the inverter 53 through a node N53 and outputting from a node N53 an inverted logic signal relative to the output of the inverter 53. Further, the level shifter circuit incorporates therein the first transistor, PMOS 55, and the second transistor, PMOS 56, each source, the first electrode, of which is commonly connected to the power source potential Vpp and each drain, the second electrode, of which is respectively cross connected to each other gate, a control electrode. The level shifter circuit further incorporates therein the third transistor, NMOS 57, the drain and the source of which are respectively connected to a node N55 connecting the drain of PMOS 55 with the gate of PMOS 56 and the output terminal of the inverter 53, and the fourth transistor, NMOS 58, the drain and the source of which are respectively connected to a node N56 connecting the drain of PMOS 56 with the gate of PMOS 55 and the output terminal of the inverter 54. The gates of NMOS 57 and NMOS 58 are respectively connected to the node N56 and the node N55. The node N55 is connected to an output terminal 52 so as to output the potential of the output signal φ52.

FIG. 9 is a waveform chart illustrating various operational waveforms appeared in the level shifter circuit shown in FIG. 8. Hereinafter, description will be made as to an operation of the level shifter circuit shown in FIG. 8 with reference to FIG. 9.

Figure 9A:
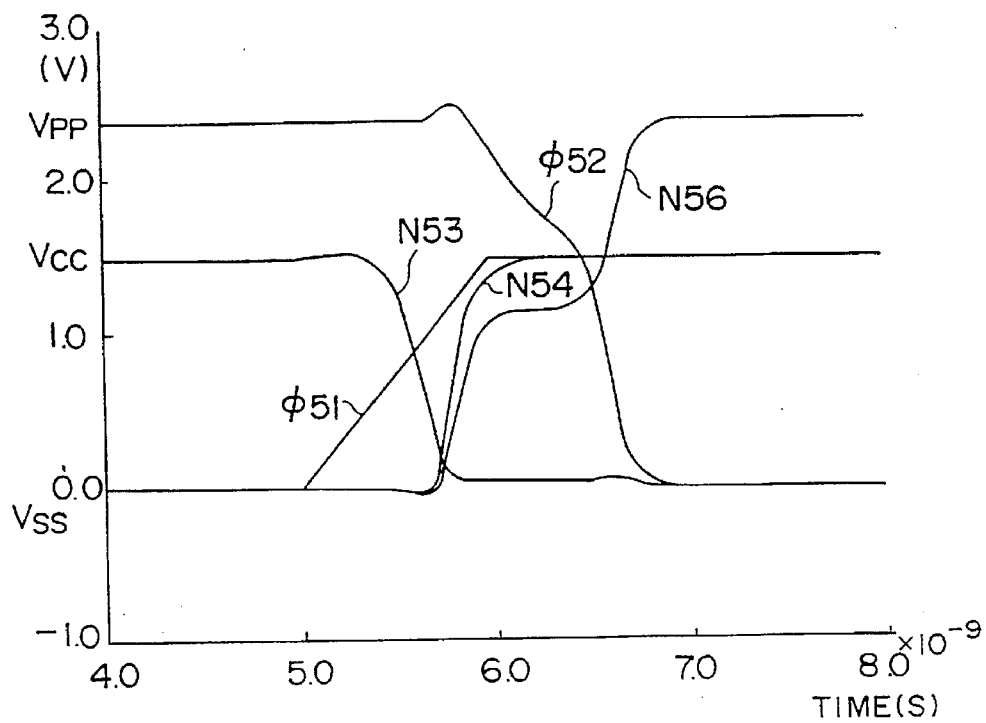
FIGS. 9a–9b is a waveform chart illustrating various operational waveforms appeared in the level shifter circuit shown in FIG. 8.

FIG. 9 shows each operational voltage waveform of the input signal φ51, the node N53, the node N54, the node N56 and the output signal φ52. As shown in FIG. 9(a), assuming that the potential of the input signal φ51 is Vss, each potential of the nodes N53, N54, and N56 and the output signal 52 reveals Vcc, Vss, Vss and Vpp, respectively so that PMOS 55, PMOS 56, NMOS 57 and NMOS 58 turn to be ON, OFF, OFF and ON states, respectively. If the potential of the input signal φ51 changes from the potential Vss to the potential Vcc, the potential of the node N53 changes, due to the inverter 53, from the potential Vcc to the potential Vss, whereas the potential of the node N54 changes from the potential Vss to the potential Vcc. On this moment, the gate potential of NMOS 58 is Vpp and the potential of the node N56 is precharged through NMOS 58. As a result, ON-resistance of PMOS becomes large, then NMOS 57 turns to be ON state, and the potential of the output signal φ52 is initiated to be dropped down from the potential Vpp, thereby reducing the rush current in particular. Moreover, when the potential of the output signal φ52 drops down, NMOS 58 turns to be OFF state and PMOS 56 turns to be ON state so that the potential of the node N56 rises up to the potential Vpp.

Figure 9B:
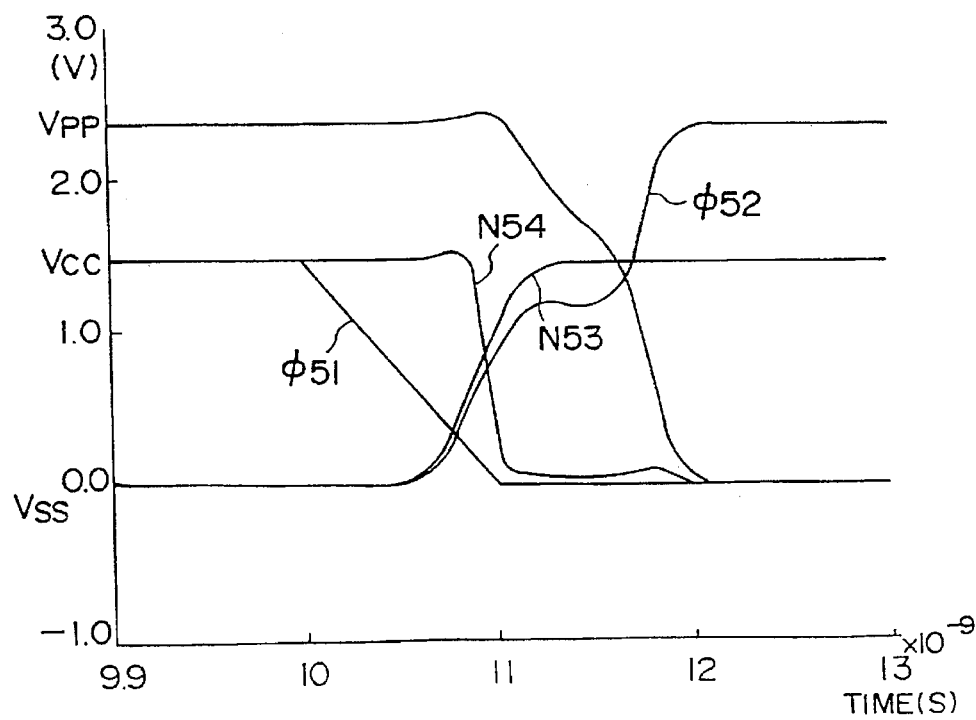

As described above, since the present embodiment is operated such that after NMOS 58 turns to be OFF state, the potential of the node N56 rises up to the potential Vpp, the rush current from the potential Vpp can be further reduced as compared to that of the first embodiment. Next, if the potential of the input signal φ51 changes from the potential Vcc to the potential Vss as shown in FIG. 9(b), the potential of the node N53 is changed to be Vcc from Vss by the inverter 53, whereas the potential of the node N54 is changed by the inverter 54 to be Vss from Vcc. On this moment, the gate potential of NMOS 57 is Vpp and the potential of the output signal φ52 is precharged through NMOS 57. As a result, ON resistance of PMOS becomes large, then NMOS 58 turns to be ON state, thereby reducing the rush current in particular. The potential of the node N56 is initiated to be dropped down from the potential Vpp due to ON state of NMOS 58. By dropping the potential of the node N56, NMOS 57 and PMOS 55 turn to be OFF and ON states, respectively so that the potential of the output signal φ52 rises up to the potential Vpp. Since the present embodiment is also operated such that the potential of the output signal φ52 rises up to the potential Vpp after NMOS 57 turns to be OFF state, the rush current normally flown from the potential Vpp to the potential Vcc can be prevented. As described above, the present embodiment is operated such that when the potential of the input signal φ51 changes from Vss to Vcc, the potential of the node N56 is firstly precharged through NMOS 58 and NMOS 57 turns to be ON state after ON resistance of PMOS 55 becomes large. As a result, the rush current from the potential Vpp to the potential Vss can be effectively reduced. Further, at the time when the potential of the output signal φ52 turns to be Vss, NMOS 58 stays in OFF state so that the rush current normally flown from the potential Vpp to the potential Vcc can be prevented. On the other hand, the rush current can be also reduced in the same way when the potential of the input signal φ51 changes from Vcc to Vss as shown in FIG. 9(b).

Figure 10:
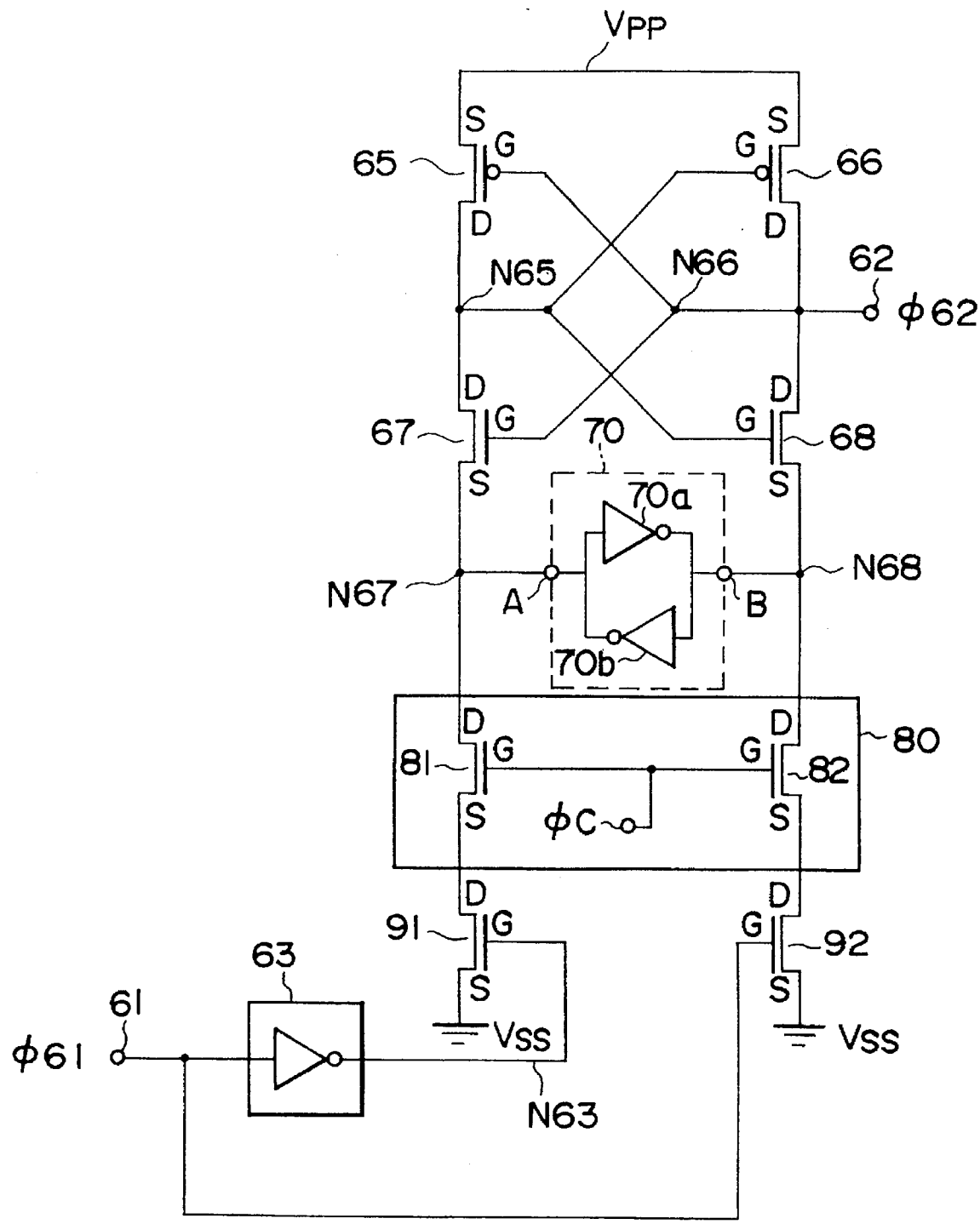
FIG. 10 is a circuit diagram illustrating a level shifter circuit according to the third embodiment of the present invention.

FIG. 10 is a circuit diagram illustrating a level shifter circuit according to the third embodiment of the present invention. The level shifter circuit shown in FIG. 10 converts the level of an input signal φ61, provided that the control signal φc is applied thereto, having an amplitude of a potential difference between the first power source potential Vcc input through an input terminal 61 and the ground potential Vss into an output signal φ62 having an amplitude of a potential difference between the second power source potential Vpp higher than the potential Vcc and the ground potential Vss, and provides the output signal φ62 to a next stage circuit through an output terminal 62. The potential of the output signal φ62 is maintained constant regardless of the potential of the input signal φ61 when the potential of the control signal φc is Vss. The level shifter circuit shown in FIG. 10 incorporates therein an inverter 63 for driving the input signal φ61, the first and second transistors, PMOS 65 and PMOS 66, each source, the first electrode, of which is commonly connected to the potential Vpp and each drain and gate, the second electrode and the control electrode, of which is cross connected with each other, the third transistor, NMOS 67, the drain of which is connected to a node N65 connecting the drain of PMOS 65 with the gate of PMOS 66, and the fourth transistor, NMOS 68, the drain of which is connected to a node N66 connecting the drain of PMOS 66 with the gate of PMOS 65. The gates of NMOS 67 and NMOS 68 are connected to nodes N66 and N65, respectively. The level shifter circuit further incorporates thereinto a potential holding circuit 70 connected between each source of NMOS 67 and NMOS 68 for operating in accordance with a potential difference between the potential Vcc and the potential Vss and for holding the potentials of the nodes N67 and N68 each connected to the sources of NMOS 67 and NMOS 68, a switch circuit 80 for connecting each node N67 and N68 with the potential Vss in response to the control signal φc, and the first and second driving circuits, NMOS 91 and NMOS 92, for connecting each node N67 and N68 with the potential Vss in accordance with the input signal φ61 and the output potential of the inverter 63. The potential holding circuit 70 is constituted of inverters 70a and 70b, each of input and output terminals of one inverter is connected to each output and input terminals of the other inverter, whereas the switch circuit 80 is constituted of NMOS 81 and NMOS 82, to both gates of which the control signal φc is applied.

FIG. 11 is a waveform chart illustrating various operational waveforms appeared in the level shifter circuit shown in FIG. 10, in which are shown each potential of the input signal φ61, the output signal φ62, the nodes N63, N65, N67 and N68, respectively.

Detailed description will be made as to the level shifter circuit shown in FIG. 10 with reference to FIG. 11. Assuming, as shown in FIG. 11(a), that the potentials of the input signal φ61 and the control signal φc are Vss and Vcc, respectively, each potential of the node N63, the node N67, the node N68, the node N65 and the output signal φ62 is Vcc, Vss, Vcc, Vss and Vpp, respectively. In other words, all of PMOS 66, NMOS 67, NMOS 81 and NMOS 91 are in ON state. If the potential of the input signal φ61 changes from Vss to Vcc, the potential of the node N63 changes from Vcc to Vss due to the inverter 63, thereby NMOS 91 turning to be OFF state. Then, NMOS 92 turns to be ON state and the potential of the node N68 becomes Vss so that the potential of the node N67 becomes Vcc due to the inverter 70b. Since the potential of the node N65 is precharged through NMOS 67, the rush current flown to the potential Vss through PMOS 66 is reduced. Also, the potential of the output signal φ62 is discharged through NMOS 68 to the potential Vss. On the other hand, the node N65 is further precharged up to the potential Vpp through PMOS 65, which reduces the rush current. If the potential of the control signal φc stays in the potential Vss, both of two NMOS 81 and NMOS 82 are in OFF state so that the potentials of the node N67 and the node N68 are maintained with the potential Vss. Accordingly, the potential of the output signal φ62 is kept in the potential Vss.

When the potential of the input signal φ61 changes from the potential Vss to the potential Vcc as shown in FIG. 11(b), the potential of the node N63 is caused to change by the inverter 63 from the potential Vss to the potential Vcc so that NMOS 92 turns to be OFF state. Then, NMOS 91 turns to be ON state, the potential of the node N67 turns to be the potential Vss and the potential of the node N68 is caused to change by the inverter 70a to the potential Vcc. As a result, since the potential to of the output signal φ62 is precharged through NMOS 68, the rush current flown to the potential Vss through PMOS 65 is suppressed and the potential of the node N65 is discharged to the potential Vss through NMOS 67.

On the other hand, the potential of the output signal φ62 is further precharged, through PMOS 66, to the potential Vpp, which reduces the rush current.

As described above, the third embodiment operates such that the potential of the input signal φ61 varies between the potential Vss and the potential Vcc, each potential of the sources of NMOS 67 and NMOS 68, the nodes N67 and N68, is determined to be the potential Vcc or the potential Vss by the inverters 70a and 70b when NMOS 81 and NMOS 82 in the switch circuit 80 are in ON state and either the node N65 or the node N66 is precharged through NMOS 67 or NMOS 68. As a result, there can be realized a level shifter circuit having a latch function with small power consumption. Also, the potential of the output signal φ62 can be preserved regardless of the input signal when NMOS 81 and NMOS 82 in the switch circuit 80 stay in OFF state.

Figure 12:
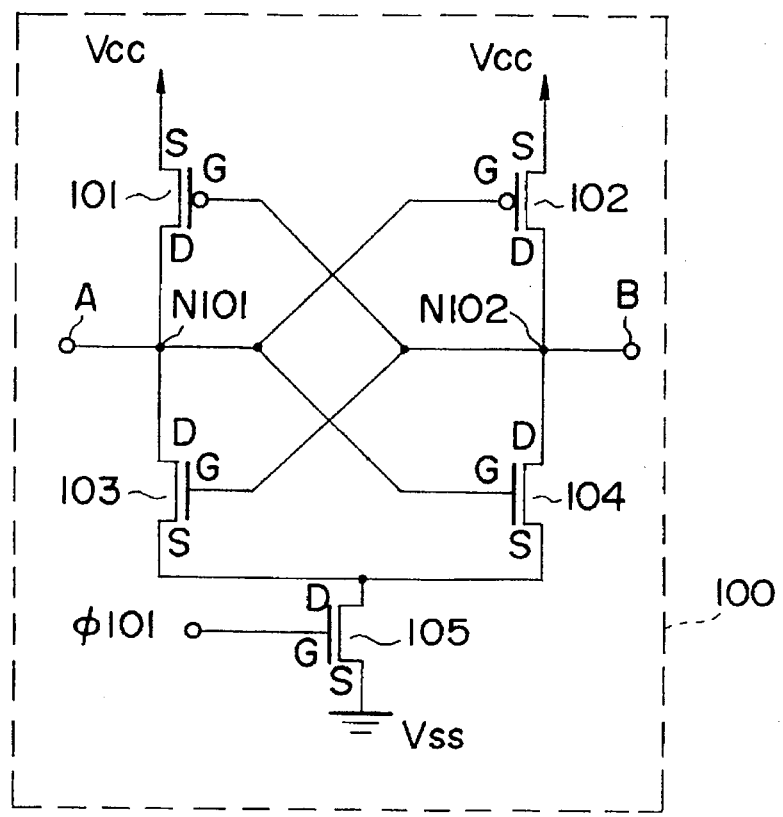
FIG. 12 is a circuit diagram illustrating another circuit example of a potential holding circuit in the level shifter circuit shown in FIG. 10.

FIG. 12 shows another circuit example of the potential holding circuit 70 in the third embodiment shown in FIG. 10, in which a circuit diagram of a potential holding circuit 100 constituted of MOS transistors is illustrated. The potential holding circuit 100 is constituted of the first and second transistors, PMOS 101 and PMOS 102, each source, the first electrode, of which is commonly connected to the power source potential Vcc and each drain and gate, the second electrode and the control electrode, of which is mutually cross connected with each other, the third transistor, NMOS 103, the drain of which is connected to a node N101 connecting the drain of PMOS 101 with the gate of PMOS 102, and the fourth transistor, NMOS 104, the drain of which is connected to a node N102 connecting the drain of PMOS with the gate of PMOS 101. Each gate of NMOS 103 and NMOS 104 is respectively cross connected to the node 102 and the node N101. There is provided NMOS 105, the drain of which is connected to both sources of NMOS 103 and NMOS 104, which turns on and off in accordance with an input signal φ101 and connects the sources of NMOS 103 and NMOS 104 with the potential Vss when it is in ON state. The nodes N101 and N102 are respectively connected to points A and B in FIG. 10.

Now, description will be made as to the operation of the level shifter circuit employing the potential holding circuit 100 shown in FIG. 12 with reference to FIGS. 10 and 12.

In this embodiment, since the potential holding circuit 70 in the level shifter circuit according to the third embodiment is replaced by the potential holding circuit 100, NMOS 105 turns to be OFF state if the input signal φ101 is set to the potential Vss when the input signal φ61 varies. As a result, the rush current flown from the potential Vcc to the potential Vss is reduced. The other operations of the fourth embodiment are similar to those of the third embodiment and there can be also realized the level shifter circuit having a latch function with small power consumption.

By turning NMOS 105 to be ON state when NMOS 81 and NMOS 82 in the switch circuit 80 stay in OFF state, the potential of the output signal φ62 is preserved regardless of the input signal.

Figure 13:
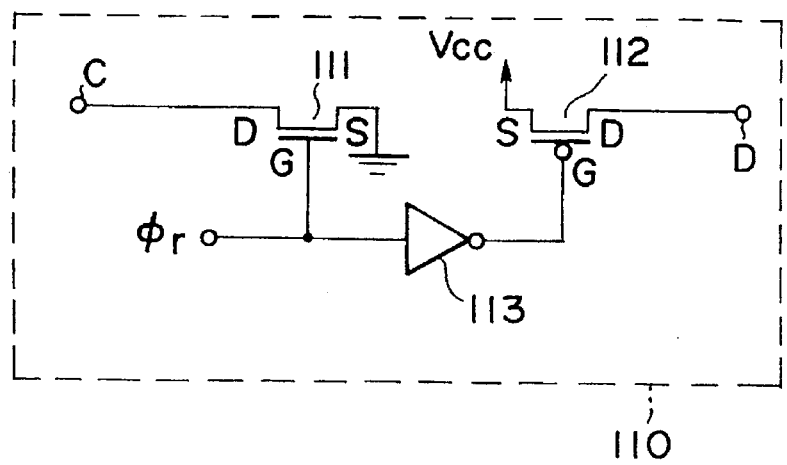
FIG. 13 is a circuit diagram illustrating another circuit example of a reset circuit in the level shifter circuit shown in FIG. 10.

FIG. 13 shows another circuit example of the reset circuit 80 according to the third embodiment shown in FIG. 10. A reset circuit 110 is constructed such that terminals C and D are connected to the nodes N67 and N68 of the level shifter circuit shown in FIG. 10 and the potentials of the nodes N67 and N68 are determined in accordance with a reset signal φr. The reset circuit 110 has the fifth transistor, NMOS 111, the first and second electrodes, the drain and the source, of which are connected to the terminal C and the potential Vss, respectively, and the sixth transistor, NMOS 112, the drain and source of which are connected to the potential Vcc and the terminal D, respectively. The reset signal φr is input to the gate of NMOS 111 and also to the gate of NMOS 112 through an inverter 113. Now, description will be made as to the operation of the level shifter circuit employing the reset circuit 110 with reference to FIG. 10. If the potential of the reset signal φr becomes Vcc, NMOS 111 turns to be ON state and the potential of the node N67 is set to Vss. Concurrently, the potential of the node N68 is set to Vcc and the potential of the output signal φ62 turns to be Vpp. In other words, a reset operation is performed. When the potential of the reset signal φr stays in the potential Vss without receiving the reset signal φp, NMOS 111 and PMOS 112 stay in OFF state so that the level shifter circuit shown in FIG. 10 performs the normal operation as shown in FIG. 11.

As described above, since the present embodiment employs the reset circuit 110 in the level shifter circuit, it can reset the output regardless of the potential of the input signal φ61.

It has to be noted that the present invention is not restricted to the above mentioned embodiments and various modifications can be accomplished.

Followings are, for example, such modifications.

(1) Each PMOS and NMOS utilized in the first to fifth embodiments can be replaced by NMOS and PMOS. In this case, the level shifter circuit can be constructed such that the input signal is input having an amplitude of a potential difference between the potentials Vcc and Vss and converted to a signal having an amplitude of a potential difference between the potentials Vcc and Vbb which is lower than Vss. This case also reveals similar advantages common to those of the first through fifth embodiments and realizes a low power consumption and a high speed operation in the second power source potential.

(2) Each PMOS and NMOS utilized in the first to fifth embodiments can be also replaced by PNP type and NPN type bipolar transistors, respectively.

(3) The reset circuit 110 can be connected in a reverse direction to the nodes N67 and N68. In this case, the potentials of the nodes N67 and N68 are respectively set to Vcc and Vss.

As described in details above, according to the first aspect of the present invention, since the first and the second driving circuits for controlling the second electrodes of the first and the second transistors are provided, the second electrode of the first transistor can be precharged from the ground potential to the second power source potential when the potential of the input signal varies, for example, in the range of the ground potential and the first power source potential. A precharge time can also be accelerated by the third transistor so that a delay time can be shortened. As a result, the second transistor is accelerated to be turned off, which can reduce the rush current flown from the second power source potential to the ground potential. Further, when the potential of the second electrode of the first transistor is escalated to be high enough, the rush current can be reduced flown from the second power source potential to the first power source potential. As a result, the burden for an internal voltage elevation circuit generating the second power source potential in semiconductor integrated circuit devices can be released.

According to the second aspect of the present invention, since the first and the driving circuits are constituted of transistors, a level shifter circuit can be realized which operates in a high speed and can be incorporated into a semiconductor integrated circuit.

According to the third aspect of the present invention, since there are provided the 11th and 12th transistors for supplying the output potentials of the third and fourth driving circuits to the second electrodes of the ninth and tenth transistors, while the second electrode of the ninth transistor is precharged from the ground potential to the second power source potential when the potential of the input signal varies in the range of the ground potential and the first power source potential, the second electrode of the ninth transistor is precharged through the 11th transistor and after the ON resistance of the 10th transistor increases, the 12th transistor turns to be ON state, thereby reducing the rush current. Since the 11th transistor turns to be OFF state if the potential of the second electrode is escalated to be high enough, the rush current can be reduced flown from the second power source potential to the first power source potential. As a result, there can be realized a level shifter circuit having a low rush current and a low power consumption.

According to the fourth aspect of the present invention, if the switch circuit turns to be ON state and the potential of the input signal varies in the range of the potentials Vss and Vcc, the potentials of each first electrode of the 15th and the 16th transistors are determined to be Vcc or Vss and the second electrodes of the 13th and the 14th transistors are precharged in accordance with the potentials of each first electrode of the 15th and the 16th transistors. Accordingly, a level shifter circuit having a latch function with low power consumption can be realized. Also, when the switch circuit stays in OFF state, the potential of the output signal can be preserved regardless of the input signal.

According to the fifth aspect of the present invention, since the potential holding circuit is constituted of the 21st through the 25th transistors, delay in the potential holding circuit and power consumption can be reduced.

According to the sixth aspect of the present invention, since there are provided the 26th and 27th transistors for connecting the second electrode of the 15th or the 16th transistor with the first power source potential or the ground potential in accordance with the potential of the reset signal, a level shifter circuit can be realized for resetting the potential of the output signal regardless of the potential of the input signal.

According to the seventh aspect of the present invention, since each transistor in the level shifter circuit is constituted of field effect transistors (FETs), a low power consumption circuit can be realized.

What is claimed is:

1. A level shifter circuit for generating an output signal having a desired level, responsive to a level of an input signal and driven by a first power source potential, comprising:

(a) first and second transistors of a first conductivity type, each including first, second, and control electrodes; wherein each said first electrode is connected to a second power source potential different from the first power source potential; wherein the second electrode of the first transistor is connected to the control electrode of the second transistor, for controlling conductance between the first and second electrodes of the second transistor; and wherein the second electrode of the second transistor is connected to the control electrode of the first transistor, for controlling conductance between the first and second electrodes of the first transistor;

(b) a first driving circuit, connected between the first power source potential and a ground potential, for controlling a potential of the second electrode of the first transistor in response to potentials of the input signal and the second electrode of the second transistor; and (c) a second driving circuit, connected between the first power source potential and the ground potential, for controlling a potential of the second electrode of the second transistor in response to a potential complimentary to the potential of the input signal and a potential of the second electrode of the first transistor.

2. A level shifter circuit as set forth in claim 1, wherein the first driving circuit comprises:

(i) a third transistor of the first conductivity type, including a control electrode, wherein the third transistor turns on and off in accordance with a potential of the input signal applied to the control electrode; a first electrode connected to a first power source electrode; and a second electrode;

(ii) a fourth transistor of a second conductivity type, including a first electrode connected to the second electrode of the third transistor, a control electrode connected to the second electrode of the second transistor, and a second electrode connected to the second electrode of the first transistor; and (iii) a fifth transistor of the second conductivity type, including a control electrode, wherein the fifth transistor turns on and off in accordance with the potential of the input signal applied to the control electrode, a first electrode connected to the second electrode of the fourth transistor, and a second electrode connected to the ground potential; and wherein the second driving circuit comprises:

(iv) a sixth transistor of the first conductivity type, including a first electrode connected to the first power source electrode, a second electrode, and a control electrode, wherein the sixth transistor turns on and off in accordance with a potential complimentary to the input signal applied to the control electrode;

(v) a seventh transistor of the second conductivity type, including a first electrode connected to the second electrode of the sixth transistor, a control electrode connected to the second electrode of the first transistor, and a second electrode connected to the second electrode of the second transistor; and (vi) an eighth transistor of the second conductivity type, including a control electrode to which the input signal is applied, wherein the eighth transistor turns on and off in accordance with the potential complimentary to the input signal.

3. A level shifter circuit as set forth in claim 2, wherein the first conductivity type transistors are PMOS transistors and the second conductivity type transistors are NMOS transistors.

4. A level shifter circuit as set forth in claim 1, further including a first driving inverter for providing the input signal to the first driving circuit, and a second driving inverter for providing the signal complementary to the input signal to the second driving circuit, wherein the second driving inverter accepts the input signal from the first driving inverter to generate the signal complimentary to the input signal.

5. A level shifter circuit as set forth in claim 1, wherein the second power source potential is greater than the first power source potential.

6. A level shifter circuit as set forth in claim 1, wherein the first transistor electrodes are sources, the second transistor electrodes are drains, and the control transistor electrodes are gates.

7. A level shifter circuit for generating an output signal having a desired level, in response to a level of an input signal, and driven by a first power source potential, comprising:

(a) first and second transistors of a first conductivity type, each including first, second, and control electrodes; wherein each first electrode is connected to a second power source potential different from the first power source potential; wherein the second electrode of the first transistor is connected to the control electrode of the second transistor, for controlling conductance between the first electrode of the second transistor and the second electrode of the second transistor; and wherein the second electrode of the second transistor is connected to the control electrode of the first transistor for controlling conductance between the first and second electrodes of the first transistor;

(b) a first driving circuit, operating between the first power source potential and a ground potential, for generating a first driving signal having two alternating potential levels in response to a potential of the input signal;

(c) a second driving circuit, operating between the first power source potential and the ground potential, and being responsive to the first driving signal for generating a second driving signal having a potential complementary to the potential of the first driving signal;

(d) a third transistor of a second conductivity type, including first, second, and control electrodes; wherein the second electrode is connected to the second electrode of the first transistor; wherein the control electrode is directly connected to the second electrode of the second transistor; and wherein the first electrode is connected to an output stage of the first driving circuit; and (e) a fourth transistor of the second conductivity type, including first, second, and control electrodes; wherein the second electrode is connected to the second electrode of the second transistor; wherein the control electrode is directly connected to the second electrode of the first transistor; and wherein the first electrode is connected to an output stage of the second driving circuit.

8. A level shifter circuit as set forth in claim 7, wherein the first conductivity type transistors are PMOS transistors and the second conductivity type transistors are NMOS transistors.

9. A level shifter circuit as set forth in claim 7, wherein the second power source potential is greater than the first power source potential.

10. A level shifter circuit as set forth in claim 7, wherein the first electrodes are sources, the second electrodes are drains, and the control electrodes are gates.

11. A level shifter circuit for generating an output signal having a desired level, in response to a level of an input signal, and driven by a first power source potential, comprising:

(a) first and second transistors of a first conductivity type, each including first, second, and control electrodes; wherein each first electrode is connected to a second power source potential different from the first power source potential; wherein the second electrode of the first transistor is connected to the control electrode of the second transistor for controlling conductance between the first and second electrodes of the second transistor; and wherein the second electrode of the second transistor is connected to the control electrode of the first transistor, for controlling conductance between the first and second electrodes of the first transistor;

(b) a third transistor of a second conductivity type, including first, second, and control electrodes; wherein the second electrode is connected to the second electrode of the first transistor; and wherein the control electrode is directly connected to the second electrode of the second transistor;

(c) a fourth transistor of a second conductivity type, including first, second, and control electrodes; wherein the second electrode is connected to the second electrode of the second transistor; and wherein the control electrode is directly connected to the second electrode of the first transistor;

(d) a potential holding circuit connected between the first electrodes of the third and fourth transistors, operating between the first power source potential and a ground potential, to preserve the potentials of the first electrodes of the third and fourth transistors;

(e) a first driving circuit which turns on and off in response to a potential of the input signal, for connecting the first electrode of the third transistor to the ground potential when the first driving circuit is in an ON state; and (f) a second driving circuit which turns on and off in a manner complementary to a state of the first driving circuit, in response to the potential of the input signal, for connecting of the fourth transistor with the ground potential when the second driving circuit is in an ON state.

12. A level shifter circuit as set forth in claim 11, further comprising a switch circuit for connected the first electrodes of the third and fourth transistors with the first and second driving circuits, respectively, in accordance with a potential of a control signal.

13. A level shifter circuit as set forth in claim 12, further comprising a fifth transistor having first, second, and control electrodes, wherein the control electrode receives the control signal; the second electrode is connected to the first electrode of the third transistor; and the first electrode is connected to the first driving circuit; and a sixth transistor having first, second, and control electrodes, wherein the control electrode receives the control signal; the second electrode is connected to the fourth transistor; and the first electrode is connected to the second driving circuit.

14. A level shifter as set forth in claim 11, wherein the potential holding circuit comprises a first inverter having input and output nodes and a second inverter having input and output nodes, wherein the input terminal of the first inverter is connected to the output node of the second inverter, and the input terminal of the second inverter is connected to the output node of the first inverter.

15. A level shifter, as set forth in claim 11, wherein the potential holding circuit comprises:

(i) seventh and eighth transistors of the first conductivity type each including first, second, and control electrodes; each first electrode being connected to the first power source potential; wherein the second electrode of the seventh transistor is connected to the control electrode of the eighth transistor; and the second electrode of the eighth transistor is connected to the control electrode of the seventh transistor;

(ii) a ninth transistor of the second conductivity type, including first, second, and control electrodes; wherein the second electrode is connected to the second electrode of the seventh transistor; and wherein the ninth transistor turns on and off in accordance with a potential of the second electrode of the eighth transistor, to connect the control electrode of the eighth transistor with the first electrode of the ninth transistor when the ninth transistor is in an ON state;

(iii) a tenth transistor of the second conductivity type having first, second, and control electrodes; wherein the second electrode is connected to the second electrode of the eighth transistor; and wherein the tenth transistor turns on and off in accordance with a potential of the second electrode of the seventh transistor, to connect the control electrode of the seventh transistor with the first electrode of the tenth transistor when the tenth transistor is in an ON state; and (iv) an eleventh transistor for connecting the first electrodes of the seventh and eighth transistors to the ground potential in accordance with the potential of a potential holding input signal.

16. A level shifter circuit as set forth in claim 15, wherein the first conductivity type transistors are PMOS transistors and the second conductivity type transistors are NMOS transistors.

17. A level shifter circuit as set forth in claim 11, wherein the circuit further comprises a reset circuit for resetting the output signal regardless of the potential of the input signal, including:

(i) a twelfth transistor connected to the first electrode of the third transistor, wherein the twelfth transistor turns on and off in accordance with a potential of a reset signal to connect the first electrode of the third transistor with the ground potential when the twelfth transistor is in an ON state; and (ii) a thirteenth transistor connected to the first electrode of the fourth transistor, wherein the thirteenth transistor turns on and off in accordance with the potential of the reset signal to connect the first electrode of the fourth transistor with the first power source potential when the thirteenth transistor is in an ON state.

18. A level shifter circuit as set forth in claim 11, wherein the first conductivity type transistors are PMOS transistors and the second conductivity type transistors are NMOS transistors.

19. A level shifter circuit as set forth in claim 11, wherein the second power source potential is greater than the first power source potential.

20. A level shifter circuit as set forth in claim 11, wherein the first electrodes are sources, the second electrodes are drains, and the control electrodes are gates.

21. A level shifter circuit as set forth in claim 7, wherein the control electrode of the third transistor is further connected to a first output node, and the control electrode of the fourth transistor is further connected to a second output node.

22. A level shifter as set forth in claim 11, wherein the control electrode of the third transistor is further connected to a third output node, and the control electrode of the fourth transistor is further connected to a fourth output node.

* * * * *